(12) United States Patent
Hines

(10) Patent No.: US 11,000,027 B2
(45) Date of Patent: May 11, 2021

(54) PEST CONTROL SYSTEM

(71) Applicant: GEKA SOLUTIONS PTY LTD, Tweed Heads (AU)

(72) Inventor: Glenn Edwin Hines, Tweed Heads (AU)

(73) Assignee: GEKA SOLUTIONS PTY LTD, Tweed Heads (AU)

( * ) Notice: Subject to any disclaimer, the term of this patent is extended or adjusted under 35 U.S.C. 154(b) by 0 days.

(21) Appl. No.: 16/755,139

(22) PCT Filed: Oct. 16, 2018

(86) PCT No.: PCT/AU2018/000198
§ 371 (c)(1),
(2) Date: Apr. 9, 2020

(87) PCT Pub. No.: WO2019/075503
PCT Pub. Date: Apr. 25, 2019

(65) Prior Publication Data
US 2020/0236923 A1    Jul. 30, 2020

(30) Foreign Application Priority Data
Oct. 17, 2017 (AU) .................. 2017904201

(51) Int. Cl.
*A01M 31/00* (2006.01)
*A01M 1/02* (2006.01)
(Continued)

(52) U.S. Cl.
CPC .......... *A01M 31/002* (2013.01); *A01M 1/026* (2013.01); *G01R 19/145* (2013.01); *G01V 3/10* (2013.01); *G01V 3/15* (2013.01)

(58) Field of Classification Search
None
See application file for complete search history.

(56) References Cited

U.S. PATENT DOCUMENTS 6,914,529 B2 * 7/2005 Barber .................. A01M 1/026
340/573.2
7,111,119 B2 * 9/2006 Minowa ................ G06F 13/385
711/114
(Continued)

FOREIGN PATENT DOCUMENTS

WO    2015/0131279 A1    9/2015
WO    2017/0027677 A1    2/2017

OTHER PUBLICATIONS

International Search Report and Written Opinion dated Dec. 11, 2018; 9 pages.

*Primary Examiner* — Fekadeselassie Girma
(74) *Attorney, Agent, or Firm* — Schwabe Williamson & Wyatt, PC

(57) ABSTRACT

A pest control system for tracking and locating the nest of the pest to improve the efficiency of pest control. The pest control system comprising a detector for detecting pests which have consumed a conducting tracking material; the detector comprising a sensing head comprising an electrical conductance loop; and a pest sensing circuit configured to sense the electrical continuity of the presence of the conducting tracking material to generate a first pest signal and comprising at least one indicator configured to indicate the first pest signal received from the sensing head. The pest control system also comprises a sensor probe comprising a body configured for inserting into a substrate to indicate the presence of a pest colony; and at least one sensor electrically connected to the pest sensing circuit and configured to generate a second pest signal to be indicated on the at least one indicator.

15 Claims, 4 Drawing Sheets

(51) Int. Cl.
*G01R 19/145* (2006.01)
*G01V 3/10* (2006.01)
*G01V 3/15* (2006.01)

(56) References Cited

U.S. PATENT DOCUMENTS

| | | | | |
|---|---|---|---|---|
| 7,212,112 | B2 * | 5/2007 | Barber | A01M 1/026 |
| | | | | 340/539.2 |
| 7,262,702 | B2 * | 8/2007 | Barber | A01M 1/026 |
| | | | | 340/572.1 |
| 7,348,890 | B2 * | 3/2008 | Barber | A01M 1/026 |
| | | | | 340/539.26 |
| 7,509,770 | B2 * | 3/2009 | Gardner, Jr. | A01M 1/026 |
| | | | | 43/107 |
| 9,542,835 | B2 * | 1/2017 | Borth | H04W 76/10 |
| 9,633,540 | B1 | 4/2017 | Teshome | |
| 2001/0009399 | A1 * | 7/2001 | Barber | A01M 1/2011 |
| | | | | 340/573.2 |
| 2001/0054962 | A1 * | 12/2001 | Barber | A01M 1/026 |
| | | | | 340/573.2 |
| 2004/0140900 | A1 | 7/2004 | Barber | |
| 2013/0105304 | A1 * | 5/2013 | Kaczur | C25B 15/00 |
| | | | | 204/237 |
| 2014/0211594 | A1 | 7/2014 | Allen | |
| 2014/0325892 | A1 * | 11/2014 | Borth | A01M 1/026 |
| | | | | 43/58 |
| 2016/0057989 | A1 * | 3/2016 | Vilinskis | A01M 1/026 |
| | | | | 340/539.13 |
| 2017/0231213 | A1 * | 8/2017 | Gordon | G05D 1/0094 |
| | | | | 43/132.1 |

* cited by examiner

PEST CONTROL SYSTEM

CROSS-REFERENCE TO RELATED APPLICATION

The present application is a national phase entry under 35 U.S.C. § 371 of International Application No. PCT/AU2018/000198, filed Oct. 16, 2018, which designates the United States of America, and which claims priority to AU Application No. 2017904201, filed Oct. 17, 2017, the entire disclosures of each of these applications are hereby incorporated by reference in their entireties and for all purposes.

TECHNICAL FIELD

The present invention relates to a pest control system. In particular, the present invention relates to a pest control system for tracking pests such as termites to a nest to improve the efficiency of pest control.

BACKGROUND ART

Pests can cause significant damage to structures such as buildings and retaining walls through feeding and/or seeking shelter. Often the damage is not apparent until manual inspection of the structure is made as subterranean pests, such as subterranean termites, enter the structure via the surrounding soil. Known pest control methods include laying physical traps or chemical traps to prevent entry of the pests to the structure or to enable poisoned food to be taken back by the pest to the nest to feed other pests. However, such traps require regular maintenance by operators which can be costly. Further these methods of pest control do not ensure the pest population is completely eradicated as they do not directly locate the nests. In addition, chemical poisons can pose an environmental risk to other animals and/or humans.

Accordingly, there is a clear need for improved methods of pest control particularly the tracking of pests and location of nests to improve the efficiency of eradication of pest populations.

It will be clearly understood that, if a prior art publication is referred to herein, this reference does not constitute an admission that the publication forms part of the common general knowledge in the art in Australia or in any other country.

OBJECT OF THE INVENTION

It is an object of the present invention to address the foregoing disadvantages or at least to provide the public with a useful choice.

The present invention is directed to a pest control system, which may at least partially overcome at least one of the abovementioned disadvantages or provide the consumer with a useful or commercial choice.

SUMMARY OF INVENTION

Pests such as termites selectively consume metals such as gold, and other materials such as zinc, sodium, magnesium, aluminium, calcium and manganese. This has been exploited and applied commercially by the inventor to enable tracking of termites which have consumed the gold back to nests in which the termite colony is located. In this way, the termites and therefore the location of the nests are made conductive which property is used to detect the nest and destroy the termite colony.

The inventor has found that particular alkaline earth metals, transition metals and other metals are selectively consumed and can be used to not only identify the presence of pests such as termites, but can also be used to track the pests back to their nest. Foraging worker termites have been found to travel as far as 400 feet from their colony in search of food and once foraging termites have been identified, a tracking system can be used to backtrack to the nest.

The pest referred to in the following description is subterranean termites but a person skilled in the art will appreciate that other pests can be controlled using the system of the present invention. Subterranean in this context means living in a substrate which can be a ground surface including soil, sand, leaves and wood.

In a first preferred embodiment of the present invention there is provided a pest control system comprising a detector for detecting pests which have consumed an edible tracking material, the detector comprising:
  a. a sensing head comprising at least one sensor for detecting the tracking material; and
  b. a pest sensing circuit configured to receive information from the at least one sensor indicating the presence of the tracking material to generate a first pest signal and comprising at least one indicator configured to indicate when the first pest signal is received from the sensing head.

In a further preferred embodiment of the present invention there is provided a pest control system comprising a detector for detecting pests which have consumed a conducting tracking material, the detector comprising:
  a) a sensing head comprising an electrical conductance loop; and
  b) a pest sensing circuit configured to sense the electrical continuity of the presence of the conducting tracking material to generate a first pest signal and comprising at least one indicator configured to indicate the first pest signal received from the sensing head.

In a further preferred embodiment of the present invention there is provided a pest control system comprising:
  i. a detector for detecting pests which have consumed a conducting tracking material, the detector comprising:
    a) a sensing head comprising an electrical conductance loop; and
    b) a pest sensing circuit configured to sense the electrical continuity of the presence of the conducting tracking material to generate a first pest signal and comprising at least one indicator configured to indicate the first pest signal received from the sensing head
  ii. a sensor probe comprising:
    a) a body configured for inserting into a substrate to indicate the presence of a pest colony; and
    b) at least one conductance sensor electrically connected to the pest sensing circuit and configured to generate a second pest signal to be indicated via the at least one indicator.

For the purposes of the specification, the term "conducting tracking material" means a material which is electrically conducting and after consumption by a pest can be detected by a detector to indicate the presence and location of the pest and the location of a nest.

Preferably, the pest control system is one in which the conducting tracking material comprises a metal. Any metal can be used but alkaline earth metals and transition metals are preferred. Gold, zinc, sodium, magnesium, aluminium, calcium and manganese and preferred metals for use.

The manner of providing the preferably metallic material will typically be determined according to the elemental form of the metallic material. For example, the pest control system is preferably one in which the gold is gold foil. However, the preferred metallic material may be provided in an appropriate form to be ingestible by pests such as termites.

Preferably, the pest control system is one in which the sensing head is enclosed by a cover which is rectangular or round in shape.

The sensing head may be mounted relative to a movement assembly to allow the sensing head to be moved over a ground surface. Any appropriate movement assembly may be used. For example, the sensing head may be provided on a wheeled or tracked cart or similar that an operator can draw over the ground surface or alternatively, a hand-held device may be provided with the sensing head provided at the lower end, to be held by an operator and moved over the ground or still further, an elongate probe or similar with the sensing head may be provided to be pushed into the ground or other article to be tested in order to detect the presence of the pests by detecting the tracking material.

Preferably, the pest control system is one in which the electrical conductance loop of the sensing head is configured to sense the presence of the conducting tracking material when in an electrically open condition in the presence of the conducting tracking material.

Preferably, the pest control system is one in which the at least one indicator of the pest sensing circuit is selected from the group consisting of a visual indication on a graphical user interface and an audible alarm.

Preferably, the pest control system is one in which the graphical user interface is a screen.

Preferably, the pest control system is one in which the pest control system also comprises a bait member comprising a body comprising at least one receptacle to receive the conducting tracking material.

Preferably, the pest control system is one in which the detector also comprises at least one handle for a user.

In still a further preferred embodiment of the present invention there is provided a method of pest control comprising the steps:
  a. placing a bait member comprising a body comprising at least one receptacle to receive the conducting tracking material in a substrate in the vicinity of a pest;
  b. detecting the presence of the pest which has been consumed conducting tracking material in the vicinity of the bait member by a detector, the detector comprising:
    i. a sensing head comprising an electrical conductance loop; and
    ii. a pest sensing circuit configured to sense the electrical continuity of the presence of the conducting tracking material to generate a first pest signal and comprising at least one indicator configured to indicate the first pest signal received from the sensing head
  c. confirming the location of a nest of the pest by inserting a sensor probe into the location, the sensor probe comprising:
    i. a body configured for inserting into a substrate to indicate the presence of a pest colony; and
    ii. at least one sensor electrically connected to the pest sensing circuit and configured to generate a second pest signal to be indicated on the at least one indicator.

The pest control systems provided in accordance with the present invention are not strictly pest control as the control portion normally comes after the identification of the presence of pests and if possible, location of the nest of pests, through the introduction of a control substance designed to kill the pests but the first step in the pest control is identification of the presence of the pests and if possible, location of the nest of pests.

The pest control system of the present invention may include other complimentary pest identification and/or pest tracking modules operating on the principles of thermal detection, moisture detection, movement detection, conductivity detection and or radar such as ground penetration radar. These complimentary modules are preferably more directed at mapping the transit lanes of foraging pests to and/or from their nest whereas the initial location of the nest and identification of the presence of the pests is preferably using the conductivity testing as explained above.

Any of the features described herein can be combined in any combination with any one or more of the other features described herein within the scope of the invention.

The reference to any prior art in this specification is not, and should not be taken as an acknowledgement or any form of suggestion that the prior art forms part of the common general knowledge.

BRIEF DESCRIPTION OF DRAWINGS

Preferred features, embodiments and variations of the invention may be discerned from the following Detailed Description which provides sufficient information for those skilled in the art to perform the invention. The Detailed Description is not to be regarded as limiting the scope of the preceding Summary of the Invention in any way. The Detailed Description will make reference to a number of drawings as follows.

DETAILED DESCRIPTION OF EMBODIMENTS

Figure 1:
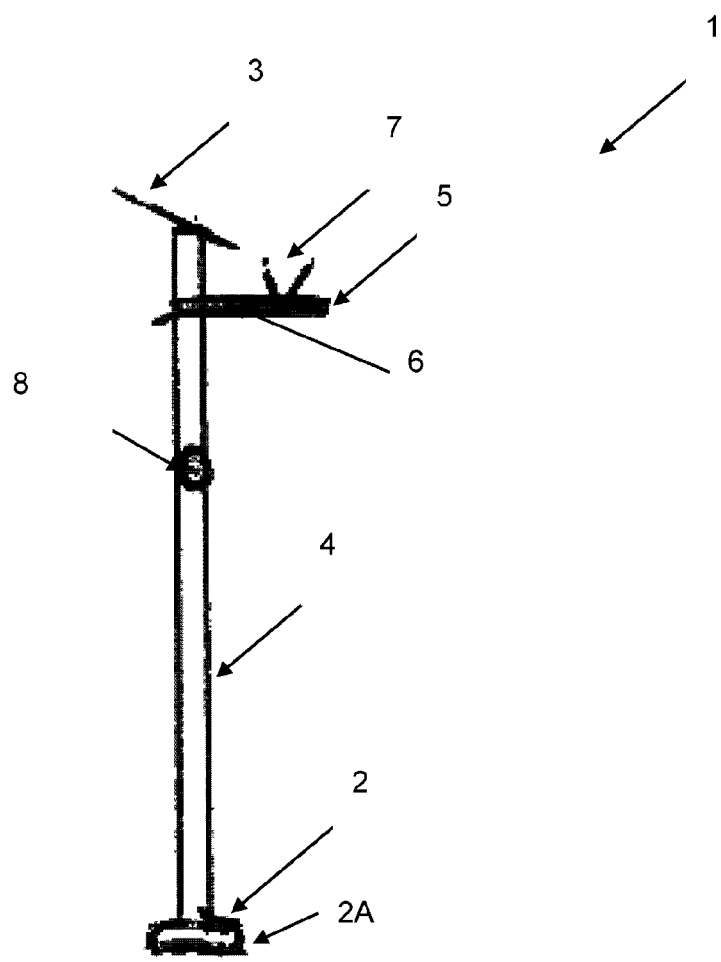
FIG. 1 shows a schematic side view of a detector member of the pest control system according to a first embodiment of the present invention.
Figure 2:
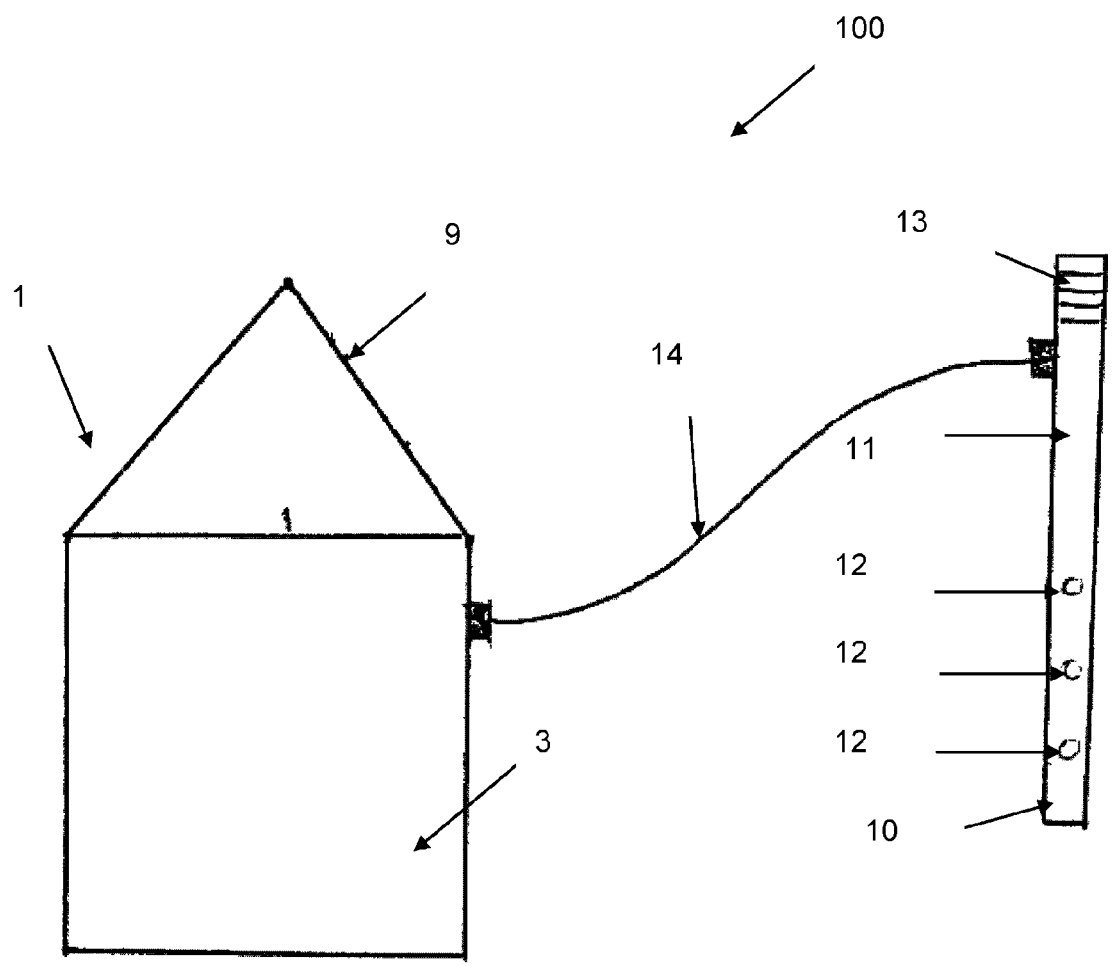
FIG. 2 shows a schematic top view of the detector member from FIG. 1 electrically connected to a sensor probe.

In a preferred form of the invention, a pest control system is generally indicated by arrow 100 shown in FIG. 2. The pest control system (100) comprising a detector (1), best seen in FIG. 1, for detecting pests which have consumed a conducting tracking material, the detector (1) comprising a sensing head (2) comprising an electrical conductance loop (not shown). The detector (1) also comprises a pest sensing circuit (not shown) configured to sense the electrical continuity or state of the electrical conductance loop in the presence of the conducting tracking material to generate a first pest signal. In this way, in the absence of the conducting tracking material the electrical conductance loop is in an electrically closed condition.

The pest sensing circuit comprises an oscillator providing alternating current, a processor, a power source and data connections configured to communicate the first pest signal to the at least one indicator in the form.

The sensing head (2) is enclosed by a cover (2A) which is rectangular or round in shape. The detector (1) also comprises at least one indicator in the form of a screen (3) and an audible alarm/buzzer configured to indicate the strength of the first pest signal received from the sensing head. The pest signal strength will depend upon the number of pests which have consumed the conducting tracking material which are detected by the sensing head (2).

The detector has an elongate shaft (4) which extends between the sensing head (2) and the screen (3) and is made from a rigid material such as Perspex or other plastic material.

The detector also comprises two handles for a user in the form of handle (5) adjustable for reach depending upon the forearm length of the user and includes a grip region (6) and forearm stabilising region (7) and a second handle (8) located on the elongate shaft (4). The detector (1) can also be carried by means of a shoulder strap (9) as shown in FIG. 2.

The pest control system (100) also comprises a sensor probe (10) comprising a body (11) configured for inserting into a substrate to detect the presence of a pest colony; and three conductance sensors (12) electrically connected to the pest sensing circuit and configured to generate a second pest signal to be indicated via the screen (3) and audible alarm. The body (11) of the sensor probe also comprises a handle (13) for ease of positioning in the substrate (such as the nest).

The detector (1) of the pest control system (100) can also be electrically connected to a pair of ear phones (not shown) via a standard earphone jack to enable the user to receive an audible indicator alarm directly.

The detector 1 is provided with a controller to control the operation of the sensor head 301 and to provide the indication of the presence of pests when sensed. The controller may be provided with a display screen and/or a speaker or similar to issue an audible sound upon detection of pests.

Although not illustrated, this embodiment would also typically include a rechargeable battery power supply, a data storage component and possibly a jack or similar connection for headphones for the operator in the case of an audible indication of positive pest detection.

The pest control system (100) also comprises at least one bait member in the form of a timber block (not shown) comprising a body with at least one receptacle to receive the conducting tracking material. In a preferred embodiment, the conducting tracking material comprises a metal in the form of gold foil which is which the inventor has found is attractive to pests such as termites as a source of food. The foil is breakable by the mouthparts of the termites which enable them to consume the gold. The gold foil is rolled up and placed in drilled holes in a wooden block which typically measures 13 cm long. The bait member with gold foil is then placed in an existing termite baiting station.

Figure 3:
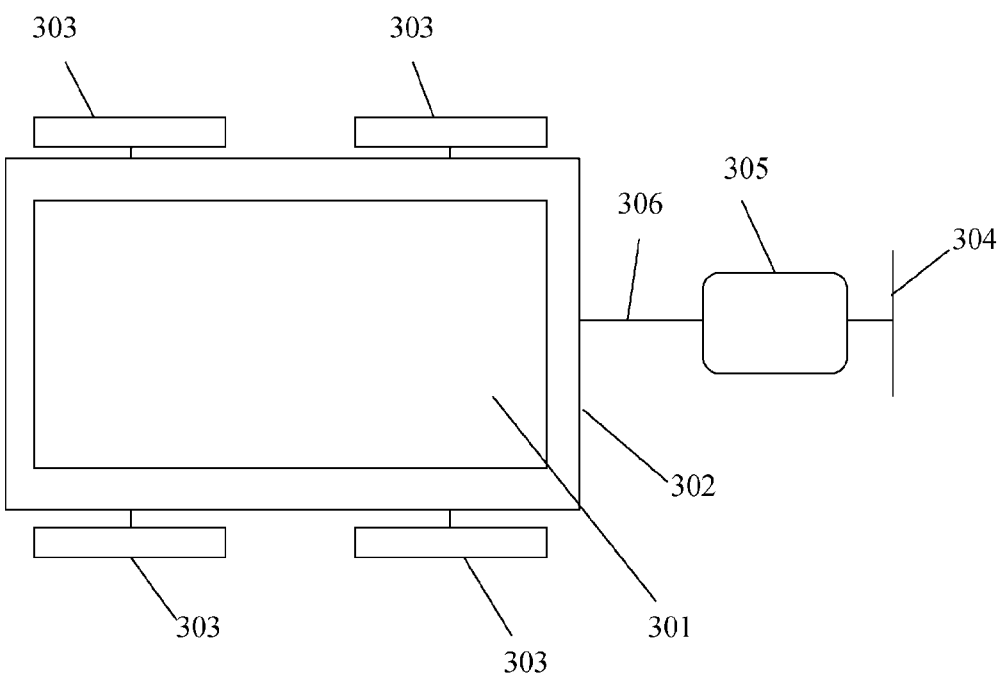
FIG. 3 is a schematic view from above of an embodiment of a detector arrangement according to a preferred embodiment of the present invention.
Figure 4:
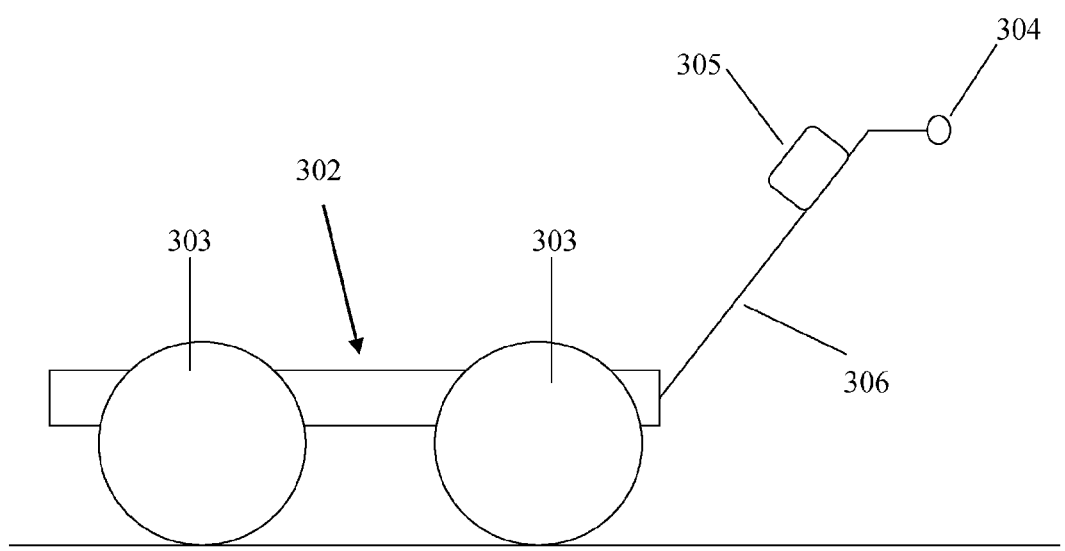
FIG. 4 is a side elevation view of the embodiment illustrated in FIG. 3.
Figure 5:
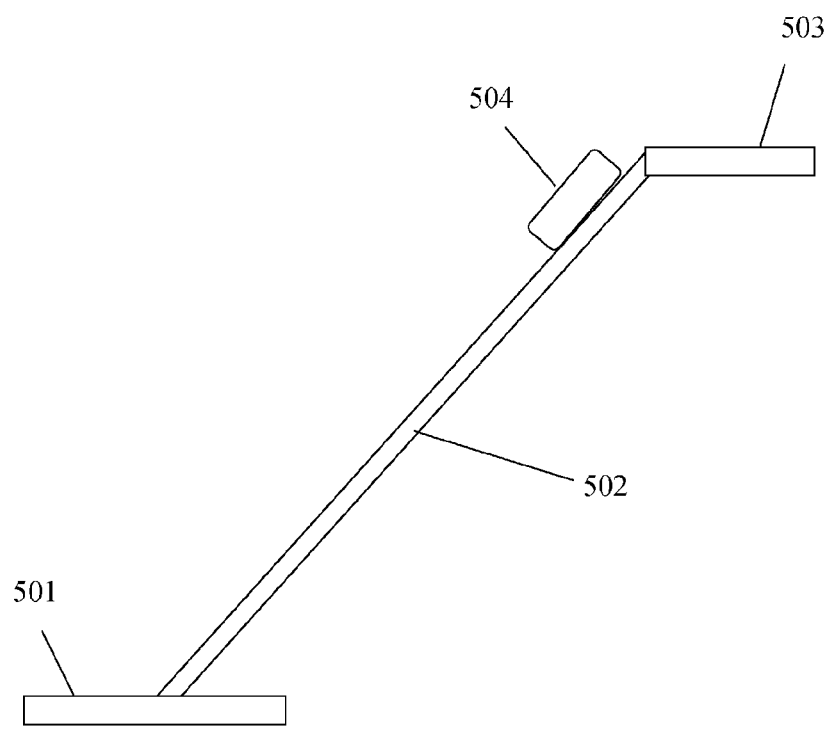
FIG. 5 is a side elevation view of a hand-held embodiment of a detector arrangement according to a preferred embodiment of the present invention.

As illustrated in FIGS. 3 to 5, a detector assembly may be provided in which the sensing head is mounted relative to a movement assembly to allow the sensing head to be moved over a ground surface.

As shown in FIGS. 3 and 4, the sensing head 301 is provided on a wheeled cart 302 or similar that an operator can draw over the ground surface. The wheeled cart 302 has four wheels 303 which space the body of the cart 302 and the sensing head 301 from the ground during operation. An elongate handle or drawbar 306 is attached to one end of the cart 302 and a handle 304 is provided at the free end of the drawbar. This embodiment is particularly adapted for level areas.

A controller 305 is provided relative to the drawbar 306, preferably at an upper end thereof to control the operation of the sensor head 301 and to provide the indication of the presence of pests when sensed. The controller may be provided with a display screen and/or a speaker or similar to issue an audible sound upon detection of pests.

Although not illustrated, this embodiment would also typically include a rechargeable battery power supply, a data storage component and possibly a jack or similar connection for headphones for the operator in the case of an audible indication of positive pest detection.

Alternatively, a hand-held device such as that illustrated in FIG. 5 may be provided with the sensing head 501 provided at the lower end of an elongate handle 502 with an upper portion 503 to be held by an operator and moved over the ground. This embodiment will also include a controller 504 is provided relative to the handle 502, preferably at an upper end thereof to control the operation of the sensor head 501 and to provide the indication of the presence of pests when sensed. The controller may be provided with a display screen and/or a speaker or similar to issue an audible sound upon detection of pests. This embodiment is particularly adapted for areas which are not level, smaller areas of with more obstacles.

The controller 305 may be detachable from the embodiment illustrated in FIGS. 3 and 4 to be attached relative to the handle 502 in the embodiment illustrated in FIG. 5.

The preferred embodiment would typically include one or more additional complimentary pest identification and/or pest tracking modules operating on the principles of thermal detection, moisture detection, movement detection, conductivity detection and or radar such as ground penetration radar. The operator will typically use the controller 305 to switch between the modules or activate more than one module concurrently if necessary.

In the preferred embodiments, the pests are typically detected using the conductive material that they have ingested. Detection of one pest is difficult but given the numbers that would usually be present, detection can be undertaken with more certainty. Once detected, the operator can then preferably use the one or more additional complimentary pest identification and/or pest tracking modules provided to track the movement of the pests through the ground in order to track the pests back to their nest. Depending on the one or more additional complimentary pest identification and/or pest tracking modules used, an indication of depth can be gained as well.

In use, the bait member and conducting tracking material is placed in the vicinity of a structure to be protected such as a wooden house or wooden retaining wall such as an existing termite baiting station. The presence of the pest which has been consumed conducting tracking material is then detected in the vicinity of the bait member by the detector. The location of a nest of the pest is then confirmed by inserting a sensor probe into the location of the nest. Once the nest has been located Thus preferred embodiments of the present invention has the advantage over the prior art including more efficient eradication of pests by decreasing the time required to locate nests and by increasing the proportion of the pest colony that is eradicated.

Reference throughout this specification to 'one embodiment' or 'an embodiment' means that a particular feature, structure, or characteristic described in connection with the embodiment is included in at least one embodiment of the present invention. Thus, the appearance of the phrases 'in one embodiment' or 'in an embodiment' in various places throughout this specification are not necessarily all referring to the same embodiment. Furthermore, the particular features, structures, or characteristics may be combined in any suitable manner in one or more combinations.

In compliance with the statute, the invention has been described in language more or less specific to structural or methodical features. It is to be understood that the invention is not limited to specific features shown or described since the means herein described comprises preferred forms of putting the invention into effect. The invention is, therefore, claimed in any of its forms or modifications within the proper scope of the appended claims appropriately interpreted by those skilled in the art.

The invention claimed is:

1. A pest control system comprising a detector for detecting pests, which have consumed an edible tracking material, and tracking the pests back to a pest colony, the detector comprising:
   a. a sensing head comprising at least one sensor for detecting the tracking material; and
   b. a pest sensing circuit configured to receive information from the at least one sensor indicating the presence of the tracking material to generate a first pest signal and comprising at least one indicator configured to indicate when the first pest signal is received from the sensing head.

2. A pest control system as claimed in claim 1 wherein the tracking material is a conducting edible tracking material and the detector comprises:
   1. a sensing head comprising an electrical conductance loop; and
   2. a pest sensing circuit configured to sense electrical continuity of the presence of the conducting tracking material.

3. A pest control system as claimed in claim 1 wherein the edible tracking material is a metallic material.

4. The pest control system as claimed in claim 1, wherein the conducting tracking material comprises a metal.

5. The pest control system as claimed in claim 4, wherein the metal is gold.

6. The pest control system as claimed in claim 3, wherein the gold is gold foil.

7. The pest control system as claimed in claim 1, wherein the sensing head is enclosed by a cover which is rectangular or round in shape.

8. The pest control system as claimed in claim 1, wherein the electrical conductance loop of the sensing head is configured to sense the presence of the conducting tracking material when in an electrically open condition in the presence of the conducting tracking material.

9. The pest control system as claimed in claim 1, wherein the at least one indicator of the pest sensing circuit is selected from the group consisting of: a visual indication on a graphical user interface and an audible alarm.

10. The pest control system as claimed in claim 1, further comprising a graphical user interface, wherein the graphical user interface is a screen.

11. The pest control system as claimed in claim 1, wherein the pest control system also comprises a bait member comprising a body comprising at least one receptacle to receive the conducting tracking material.

12. The pest control system as claimed in claim 1, wherein the detector also comprises at least one handle for a user.

13. A method of pest control comprising the steps:
   a. placing a bait member comprising a body comprising at least one receptacle to receive a conducting tracking material in a substrate in the vicinity of a pest;
   b. using a detector to detect the presence of the pest which has consumed the conducting tracking material in the vicinity of the bait member and tracking the pests back to a pest colony, the detector comprising:
      i. a sensing head comprising an electrical conductance loop; and
      ii. a pest sensing circuit configured to sense the electrical continuity of the presence of the conducting tracking material to generate a first pest signal and comprising at least one indicator configured to indicate the first pest signal received from the sensing head.

14. A method of pest control as claimed in claim 13 further comprising the step of confirming the location of a nest of the pest by inserting a sensor probe into the location, the sensor probe comprising:
   i. a body configured for inserting into a substrate to indicate the presence of the pest colony; and
   ii. at least one sensor electrically connected to the pest sensing circuit and configured to generate a second pest signal to be indicated on the at least one indicator.

15. A pest control system comprising:
   a. a detector for detecting pests, which have consumed a tracking material, and tracking the pests back to a pest colony, the detector comprising:
      i. a sensing head comprising an electrical conductance loop; and
      ii. a pest sensing circuit configured to sense the electrical continuity of the presence of the conducting tracking material to generate a first pest signal and comprising at least one indicator configured to indicate the first pest signal received from the sensing head
   b. a sensor probe comprising:
      i. a body configured for inserting into a substrate to indicate the presence of the pest colony; and
      ii. at least one conductance sensor electrically connected to the pest sensing circuit and configured to generate a second pest signal to be indicated via the at least one indicator.

* * * * *